(12) United States Patent
Azuma

(10) Patent No.: US 7,606,628 B2
(45) Date of Patent: Oct. 20, 2009

(54) DESIGN AND MANUFACTURING MANAGEMENT SYSTEM, METHOD, AND PROGRAM

(75) Inventor: Kiyonori Azuma, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 629 days.

(21) Appl. No.: 11/104,616

(22) Filed: Apr. 13, 2005

(65) Prior Publication Data

US 2006/0155407 A1 Jul. 13, 2006

(30) Foreign Application Priority Data

Jan. 7, 2005 (JP) .............................. 2005-002548

(51) Int. Cl.
*G06F 17/50* (2006.01)
*G06G 7/48* (2006.01)
*G06F 19/00* (2006.01)

(52) U.S. Cl. ................. 700/107; 703/1; 703/6; 707/104.1

(58) Field of Classification Search .......... 703/1, 703/6; 707/104.1; 700/97, 107
See application file for complete search history.

(56) References Cited

U.S. PATENT DOCUMENTS

| | | | | |
|---|---|---|---|---|
| 5,311,438 A | * | 5/1994 | Sellers et al. ................ 700/96 |
| 6,110,213 A | * | 8/2000 | Vinciarelli et al. ............. 703/1 |
| 6,295,513 B1 | * | 9/2001 | Thackston ...................... 703/1 |
| 6,678,877 B1 | * | 1/2004 | Perry et al. .................... 716/15 |
| 7,337,029 B2 | * | 2/2008 | Oyamada et al. .............. 700/97 |
| 7,340,446 B2 | * | 3/2008 | Rajarajan et al. ............... 707/3 |
| 2002/0052807 A1 | * | 5/2002 | Han et al. ...................... 705/27 |
| 2006/0287750 A1 | * | 12/2006 | Oyamada et al. ............ 700/105 |

* cited by examiner

Primary Examiner—Albert DeCady
Assistant Examiner—Sunray R Chang
(74) Attorney, Agent, or Firm—Staas & Halsey LLP

(57) ABSTRACT

A drawing edit management unit of a design management server manages an E-BOM created from a CAD design drawing by storing the E-BOM in a E-BOM database, and notifies a manufacturing management server of design completion. A design change display processing unit causes design change permitted ranges and forbidden ranges to be displayed, upon design change, in accordance with design change verification information of a design change verification database. A parts order management unit of the manufacturing management server requests confirmation when receiving the design completion notice, and manages a M-BOM, to which preparation information including order instructions and manufacturing instructions of a part is added and which has been created from the E-BOM after confirmation, by storing the M-BOM in a M-BOM database. A design change verification processing unit manages design change verification information created from the preparation information of the M-BOM by storing the design change verification information in a design verification database.

15 Claims, 18 Drawing Sheets

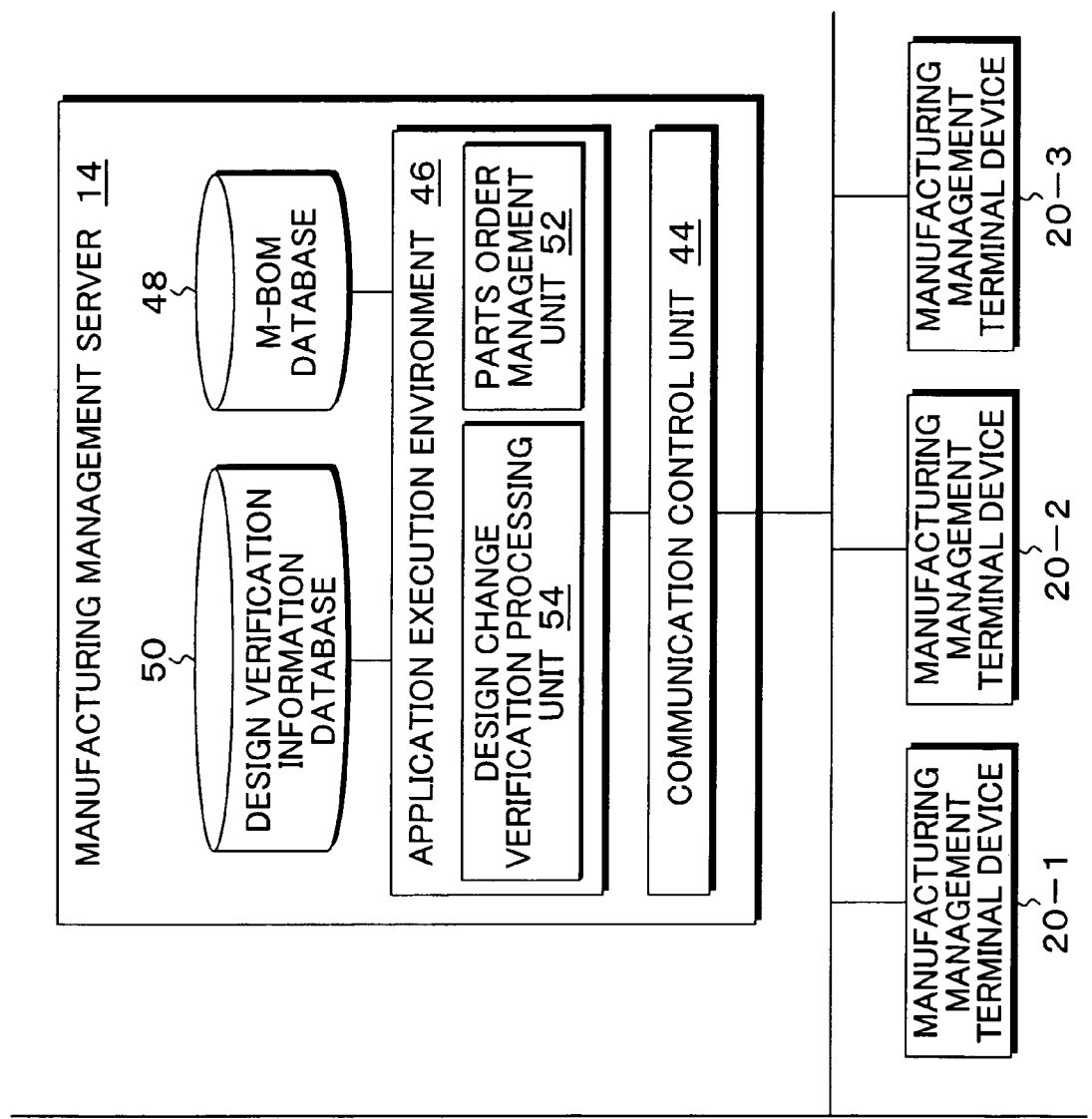

FIG. 6

| DWG. NO. | REVISION VERSION NO. | NAME | ITEM NO. | BALLOON | SPECIFICATION | COST | DESIGN CHANGEABLE RANGE |
|---|---|---|---|---|---|---|---|
| 102 | 104 | 106 | 108 | 110 | 112 | 114 | 116 |
| K001 | 1 | CASE | KB001 | A | 1t*400*300 | 100 | FORBIDDEN |
| | | | | B | π100 | 100 | PERMITTED |
| | | | | C | 90° | 50 | PERMITTED |

| ITEM NO. | REVISION VERSION NO. | NAME | DWG. NO. | BALLOON | PROCEDURE | PROCESS CODE |
|---|---|---|---|---|---|---|
| KB001 | 1 | CASE | K001 |  | 1 | 001 |
|  |  |  |  | A | 2 | 005 |
|  |  |  |  | B | 3 | 003 |
|  |  |  |  | C | 4 | 008 |
|  |  |  |  |  | 5 | 009 |

192

| PROCESS NAME | COST | PREPARATION |
|---|---|---|
| PURCHASE | 500 | ORDER INSTRUCTION |
| CUTTING | 100 | MANUFACTURING INSTRUCTION |
| BORING | 100 | UNPROCESSED |
| BENDING | 50 | UNPROCESSED |
| INSPECTION | 200 | UNPROCESSED |

| ITEM NO. | NAME | VENDOR | NO. OF ORDERED PIECES | ORDERED DATE | DUE |
|---|---|---|---|---|---|
| KB001 | CASE | ×× CO., LTD. | 1000 | 2004/12/03 | 2004/12/10 |

| ITEM NO. | NAME | DWG. NO. | PROCEDURE | PROCESS NAME | PROCESS CODE | SPECIFICATION | PROCESSED NO. OF PIECES | WORK DUE |
|---|---|---|---|---|---|---|---|---|
| KB001 | CASE | K001 | 2 | CUTTING | 005 | 1t*400*300 | 1000 | 2004/12/13 |
| KB001 | CASE | K001 | 3 | BORING | 003 | π100 | 1000 | 2004/12/13 |
| KB001 | CASE | K001 | 4 | BENDING | 008 | 90° | 1000 | 2004/12/13 |

FIG. 9

| DWG. NO. 210 | REVISION VERSION NO. 212 | ITEM NO. 214 | BALLOON 216 | PROCEDURE 218 | PROCESS CODE 220 | PREPARATION INFORMATION 222 | 208 |
|---|---|---|---|---|---|---|---|
| K001 | 1 | KB001 | A | 2 | 005 | COMPLETED | |
| | | | B | 3 | 003 | UNPROCESSED | |
| | | | C | 4 | 008 | UNPROCESSED | |

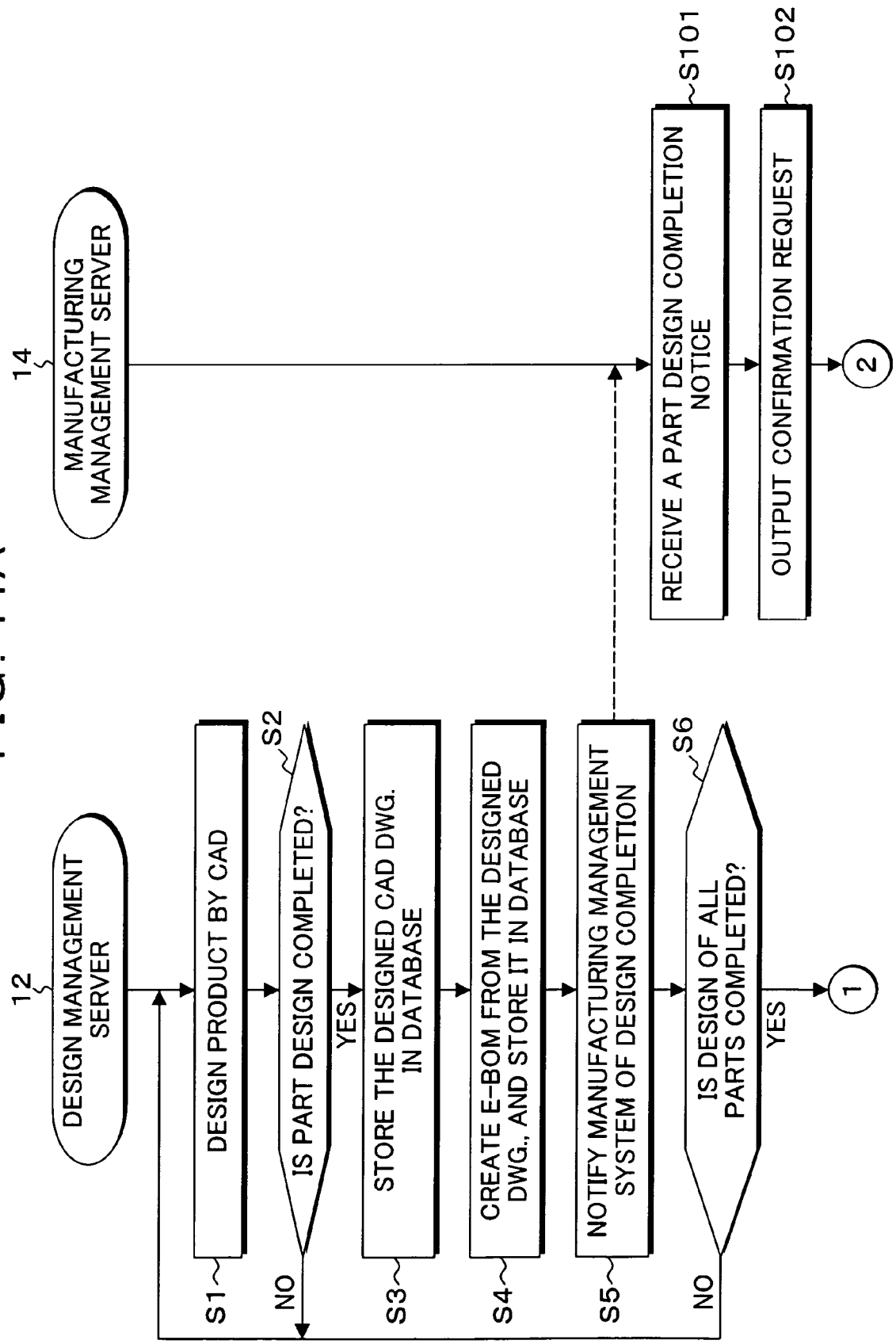

DESIGN AND MANUFACTURING MANAGEMENT SYSTEM, METHOD, AND PROGRAM

This application is a priority based on prior application No. JP 2005-2548, filed Jan. 7, 2005, in Japan.

BACKGROUND OF THE INVENTION

1. Field of the Invention

The present invention relates to design and manufacturing management systems, methods, and programs for performing management from designing to manufacturing of a product according to a production plan, particularly, relates to design and manufacturing management systems, methods, and programs for achieving mutual coordination of information between designing and manufacturing of a product.

2. Description of the Related Arts

Conventionally, when a manufacturer manufacturing electronic appliances, personal computers, peripheral devices, etc. is to sell a new product, demands for the product or the like is predicted thereby making a production plan of, for example, product specifications and the production volume. In accordance with the production plan, designing of the product is instructed to a design department. When the product drawing is completed through design work of the design department, the product drawing is delivered to a manufacturing department, wherein order of parts and manufacturing are performed, such that the product can be completed and prepared for the scheduled sale date. The product designing in the manufacturing department is a design operation using a CAD, and the drawings created through design operations are stored in a CAD drawing database. When designing is completed, in accordance with the CAD drawing, an E-BOM (Engineering-Bill Of Materials) is created by use of a drawing edit management tool, and stored in an E-BOM database. In accordance with the E-BOM in the E-BOM database, the manufacturing department received a design completion notice creates a M-BOM (Manufacturing-Bill Of Materials) by use of a manufacturing management tool, and stores it in a M-BOM database. The M-BOM sets, regarding a plurality of parts composing the product, detailed processing methods and procedures for actually producing products, and includes manufacturing instructions and order instructions of parts. Meanwhile, in the manufacturing department, the delivery date of the product shipment is advanced by sequentially ordering the parts of which designing has been determined during development of the new product. At this point, the persons in charge of orders take it into consideration that which order sequence of the parts makes the delivery date of the product shipment the shortest. Moreover, the persons perform ordering while constantly checking which part is finished with designing and whether the finished schedule is determined. In such management in the manufacturing department, improvement of the economical efficiency and shortening of the lead time in the product manufacturing have been large objectives, and various attempts have long been made regarding the preparation of the parts.

However, in such conventional design and manufacturing management, design information such as design plans, CAD drawings, and E-BOMs in the design department and manufacturing information such as production plans and M-BOMs in the manufacturing department have been managed in separated databases; therefore, the persons in charge in the manufacturing department have to consider the order sequence of parts for each of the parts while checking the progress of the operations in the design department, and have to always consider the progress state of the design department, thereby causing great workload, which is problematic. Meanwhile, in the design department, sometimes design change is required after the design is determined. However, since the manufacturing information of the design-determined parts is managed in the separated database of the manufacturing department, there is no means for minutely notifying the persons in charge of designing whether the parts have already been ordered, thereby causing a problem that it takes labor and time for understanding the state of the manufacturing department when design is to be changed.

SUMMARY OF THE INVENTION

According to the present invention, there are provide a design and manufacturing management system, a method, and a program for improving the efficiency of the processes of the design department and the manufacturing department by coordinating the design information and the manufacturing information managed in separate databases.

The present invention provides a design and manufacturing management system composed of a design management unit and a manufacturing management unit. In the design and manufacturing management system of the present invention, in the design management unit, a design processing unit for managing a design drawing, which has been created by means of computer aid, by storing the design drawing in a design drawing database, a drawing edit management unit for managing an E-BOM created from the design drawing by storing the E-BOM in an E-BOM database, and for notifying the manufacturing management unit of design completion, and a design change display processing unit for causing design change permitted range and forbidden range to be displayed, upon design change of the product, in accordance with design change verification information in a design change verification database are provided; and in the manufacturing management unit, a part order management unit for requesting confirmation when receiving the design completion notice from the drawing edit management unit, and managing a M-BOM, to which preparation information including an order instruction and a manufacturing instruction of a part is added and which has been created in accordance with the E-BOM after a confirmation response is input, by storing the M-BOM in a M-BOM database, and a design change verification processing unit for managing the design change verification information which has been created in accordance with the preparation information of the M-BOM by storing the design change verification information in the design verification database are provided.

Herein, the drawing edit management unit notifies the part order management unit of design completion each time part designing of the product is completed.

The design change verification processing unit determines design change permitted range and forbidden range in accordance with the progress state of the manufacturing instruction and the order instruction of the part in the M-BOM, and updates the design change verification information.

The design change verification processing unit sets forbiddance of design change of the part on which the order instruction has been performed. Moreover, the design change verification processing unit sets forbiddance of design change of the part on which the manufacturing instruction has been performed.

The M-BOM sets a plurality of processes necessary for part processing, and the design change verification processing unit sets forbiddance of design change of the processed unit of the part on which the manufacturing instruction has been performed.

The present invention provides a design and manufacturing management method. The design and manufacturing management method of the present invention includes a design processing step of managing a design drawing, which has been created by means of computer aid, by storing the design drawing in a design drawing database;

a drawing edit management step of managing an E-BOM created from the design drawing by storing the E-BOM in an E-BOM database, and for notifying design completion;

a part order management step of requesting confirmation when receiving the design completion notice in the drawing edit management step, and managing a M-BOM, to which preparation information including an order instruction and a manufacturing instruction of a part is added and which has been created in accordance with the E-BOM after a confirmation response is input, by storing the M-BOM in a M-BOM database;

a design change verification processing step of managing design change verification information which has been created in accordance with the preparation information of the M-BOM by storing the design change verification information in the design verification database; and a design change display processing step of causing design change permitted range and forbidden range to be displayed, upon design change of the product, in accordance with the design change verification information in a design change verification database.

The present invention provides a design management program. The design management program of the present invention causes a computer of a design management system to execute a design processing step of managing a design drawing, which has been created by means of computer aid, by storing the design drawing in a design drawing database;

a drawing edit management step of managing an E-BOM created from the design drawing by storing the E-BOM in an E-BOM database, and for notifying a manufacturing management system of design completion; and a design change display processing step of causing design change permitted range and forbidden range to be displayed, upon design change of the product, in accordance with the design change verification information which has been created in the manufacturing management system and is in a design change verification database.

The present invention provides a manufacturing management program. The manufacturing management program of the present invention causes a computer of a manufacturing management system to execute a part order management step of requesting confirmation when receiving a design completion notice from a design management system, and managing a M-BOM, to which preparation information including an order instruction and a manufacturing instruction of a part is added and which has been created in accordance with an E-BOM in an E-BOM database after a confirmation response is input, by storing the M-BOM in a M-BOM database; and a design change verification processing step of managing design change verification information which has been created in accordance with the preparation information of the M-BOM by storing the design change verification information in a design verification database.

It should be noted that details of the design and manufacturing management method and the programs according to the present invention are basically same as that of the design and manufacturing management system of the present invention.

According to the present invention, when designing of a part is completed, it is notified to the manufacturing management system and confirmation is requested to the persons in charge thereat; therefore, the persons in charge in the manufacturing department are always capable of understanding the progress state of the design department without checking the progress state of the design department, operations in the manufacturing department can be efficiently started in accordance with the design completion notice, and the load imposed on the persons in charge can be significantly reduced. Moreover, regarding the design-completed part, operations such as that of order and manufacturing instructions in the manufacturing department can be immediately started, thereby shortening the lead time up to completion of the product. Moreover, the design change permitted ranges and forbidden ranges are caused to be displayed in accordance with the progress state of the production department when design is to be changed; accordingly, the persons in charge of designing are capable of understanding, in a sequential manner, how much design change is allowed without the need of inquiry or the like to the manufacturing department, and the design change operations can be efficiently performed on the appropriate ranges corresponding to the progress state of manufacturing.

The above and other objects, features, and advantages of the present invention will become more apparent from the following detailed description with reference to the drawings.

BRIEF DESCRIPTION OF THE DRAWINGS

FIGS. 1A and 1B are block diagrams of a functional configuration of a design and manufacturing management system according to the present invention;

FIG. 6 is an explanatory diagram of an E-BOM created from the CAD drawing of FIG. 5;

FIGS. 8A, 8B, and 8C are explanatory diagrams of a M-BOM, an order instruction description, and work instruction description created for the case of FIGS. 7A and 7B;

FIG. 9 is an explanatory diagram of the design change verification information created from the M-BOM of FIGS. 7A and 7B, and the order instruction description and the manufacturing instruction descriptions;

FIGS. 11A, 11B, and 11C are time charts of the management process for achieving coordination between the design management server and the manufacturing management server of FIGS. 1A and 1B;

DETAILED DESCRIPTION OF THE PREFERRED EMBODIMENTS

Figure 1A:
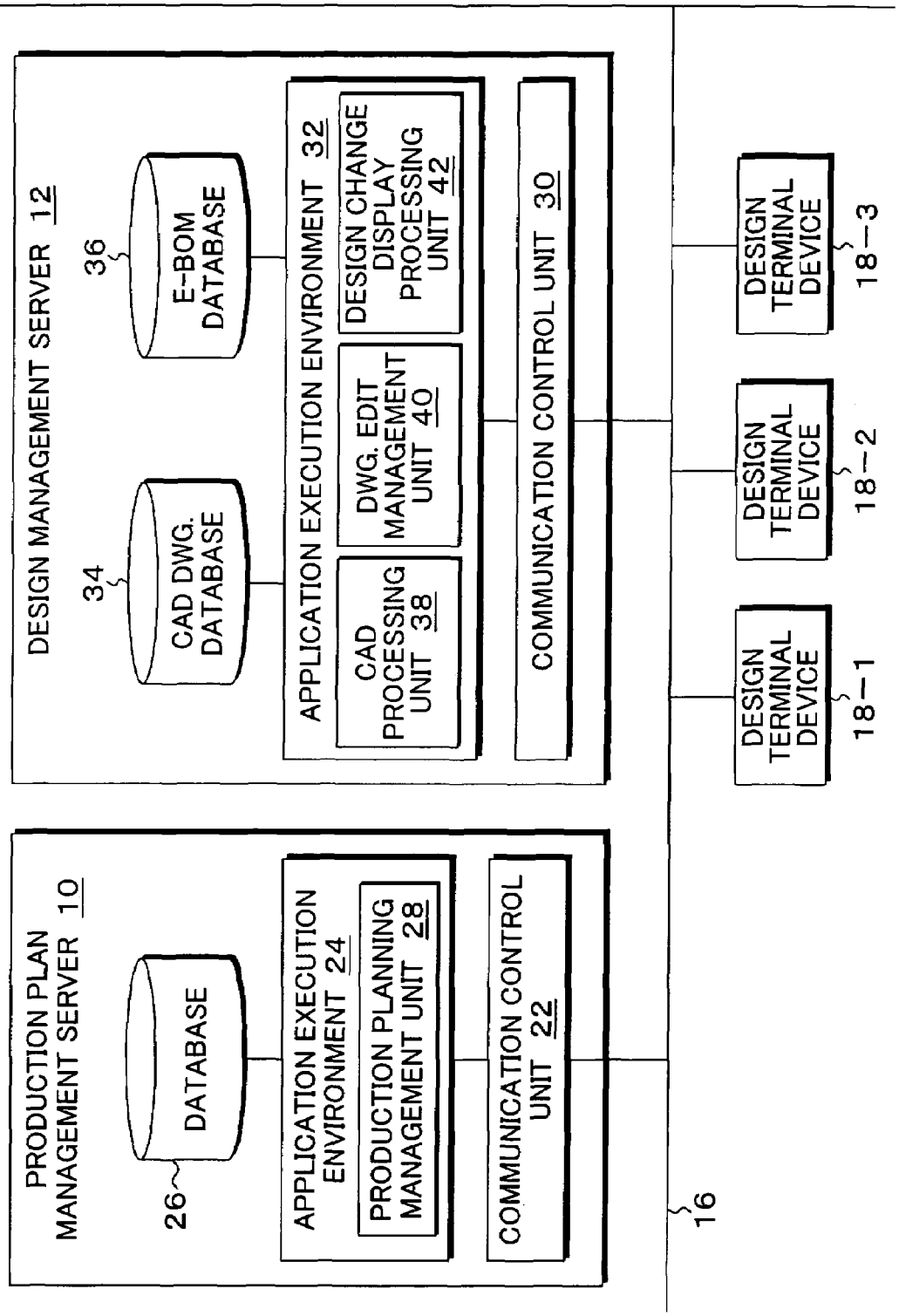

FIGS. 1A and 1B are block diagrams of a functional configuration of a design and manufacturing management system according to the present invention. In FIGS. 1A and 1B, the design and manufacturing management system of the present invention comprises a design management server 12 and a manufacturing management server 14, wherein a production plan management server 10 is provided as a server for totally managing both the servers. The production plan management server 10, the design management server 12, and the manufacturing management server 14 can perform communication of information with one another through a network such as a LAN 16. In the production plan management server 10, a communication control unit 22, an application execution environment 24, and a database 26 are provided, wherein a production planning management unit 28 is installed as a program module in the application execution environment. The production planning management unit 28 makes, according to received orders and expected demands of products, a production plan which covers from designing to manufacturing, and to shipment, instructs the design management server 12 to perform a design process according to a design plan, and also instructs the manufacturing management server 14 to perform manufacturing management according to the design results of the design management server 12.

In the design management server 12, a communication control unit 30, an application execution environment 32, a CAD drawing database 34, and an E-BOM database 36 are provided; and in the application execution environment 32, functions of a CAD processing unit 38, a drawing edit management unit 40, and a design change display processing unit 42 implemented by programs are provided. Design terminal devices 18-1 to 18-3 used by persons in charge of designing in design work are connected to the design management server 12 via the network 16. The CAD processing unit 38 provided in the application execution environment 32 of the design management server 12 is a common CAD system, and manages designed drawings, which have been created at the design terminal devices 18-1 to 18-3 by means of computer aid, by storing them in the CAD drawing database (design drawing database) 34. The design work performed at the design terminal devices 18-1 to 18-3 serving as the clients of the CAD processing unit 38 is function designing of a product according to design instructions instructed from the production plan management server 10. The drawing edit management unit 40 creates engineering bills of materials (E-BOMs) from already created CAD drawings stored in the CAD drawing database 34, and manages them by storing them in the E-BOM database 36. Herein, the function design of the product in the CAD processing unit 38 comprises a product assembly drawing and parts design drawings of a plurality of parts required for assembling the product. Each time when a part design drawing is completed by the CAD processing unit 38 and the part CAD drawing is stored in the CAD drawing database 34, the drawing edit management unit 40 creates an E-BOM of the corresponding part of which designing has been completed and stores it in the E-BOM database 36. Moreover, the present invention is configured to notify the manufacturing management server 14 of design completion via the LAN 16 each time an E-BOM of the part of which designing has been completed is created at the drawing edit management unit 40. The coordination of information between the design management server 12 and the manufacturing management server 14 is achieved by sending a design completion notice to the manufacturing management server 14 at the timing of E-BOM creation at the design management server 12. The manufacturing management server 14 comprises a communication control unit 44, an application execution environment 46, a M-BOM database 48, and a design verification database 50; and, in the application execution environment 46, a parts order management unit 52 and a design change verification unit 54 are provided as the functions that are implemented by execution of programs. Upon reception of the design completion notice from the design management server 12, the parts order management unit 52 requires persons in charge using manufacturing management terminal devices 20-1 to 20-3, which are serving as the clients of manufacturing management, confirmation against the reception of the design completion notice, detects the input operations of confirmation response of the persons in charge, and then, creates a manufacturing bill of management (M-BOM) in accordance with the E-BOM which is corresponding to the design completion notice and stored in the E-BOM database 36 of the design management server 12, and stores it in the M-BOM database 48. Added to the M-BOM created at the parts order management unit 52 are, as preparation information, manufacturing instructions including detailed processing methods and procedures for performing production planning for actually producing a product according to the E-BOM and order instructions for purchasing required parts. The persons in charge in the manufacturing management department use the manufacturing management terminal devices 20-1 to 20-3 provided as clients of the manufacturing management server 14, so as to perform, under the management of the manufacturing management server 14, creation operations of the M-BOM of the part of which designing has been completed by the function of the parts order management unit 52. Certainly, upon creation of the M-BOMs by use of the manufacturing management terminal devices 20-1 to 20-3, the parts order management unit 52 requires the side of the manufacturing management terminal devices 20-1 to 20-3 confirmation corresponding to the design completion notices notified from the design management server 12.

When the persons in charge input confirmation responses against the confirmation requirement, the operations for production designing, manufacturing instructions, and ordering instructions relating creation of the M-BOMs are started. Therefore, without specifically checking the progress state of designing in the design management server 12 side, the persons in charge in the manufacturing department can start necessary operations when they receive design completion notices from the design management server 12. Thus, the workload of, for example, constantly checking the progress state in the design department which is managed by the design management server 12 is not required, and the load imposed on the persons in charge in the manufacturing management department can be significantly reduced by virtue of the coordination with the design management server 12. The design change verification processing unit 54 creates design change verification information according to the preparation information including the order instructions and the manufacturing instructions of parts added to the M-BOM created by the parts order management unit 52, and stores it in the design verification database 50. Moreover, the design change verification processing unit 54 monitors the progress state of the manufacturing or the ordering according to the M-BOM which is created at and managed by the parts order management unit 52, and, if the progress state of the preparation information including that of manufacturing and ordering is changed, updates the design verification information in the design verification database 50 such that the change in the preparation information is reflected. Such design verification information managed by the manufacturing management server 14 is utilized by being reflected to the design change display processing unit 42 provided in the design management server 12. When the persons in charge in the side of the design terminal devices 18-1 to 18-3 connected to the design management server 12 are to change the design of the part of which design has been completed, there performed a process of reading, from the CAD drawing database 34, the drawing of the part of which design is to be changed through access to the CAD processing unit 38 with the drawing number serving as a key. At this time, the design change display processing unit 42 obtains the corresponding design verification information from the design verification information database 50 of the manufacturing management server 14 with the same drawing number serving as a key; and, according to the design change permitted range and forbidden range specified according to the preparation information of order instructions and manufacturing instructions that are set for the design verification information, causes the design change permitted range and forbidden range to be displayed in the drawing of the part of which design is to be changed in the side of the design terminal devices 18-1 to 18-3. Therefore, without inquiring of the persons in charge in the manufacturing department for the manufacturing state and the ordering state of the part in the manufacturing department, the persons in charge in the design department can recognize, from a screen display when the design is to be changed, the design change permitted range and forbidden range according to the design verification information to which the preparation information of the part in the manufacturing management server 14 is reflected, and can perform the necessary operations of changing design within the permitted range matching the progress state of manufacturing and ordering of the part in the manufacturing department.

Figure 2:
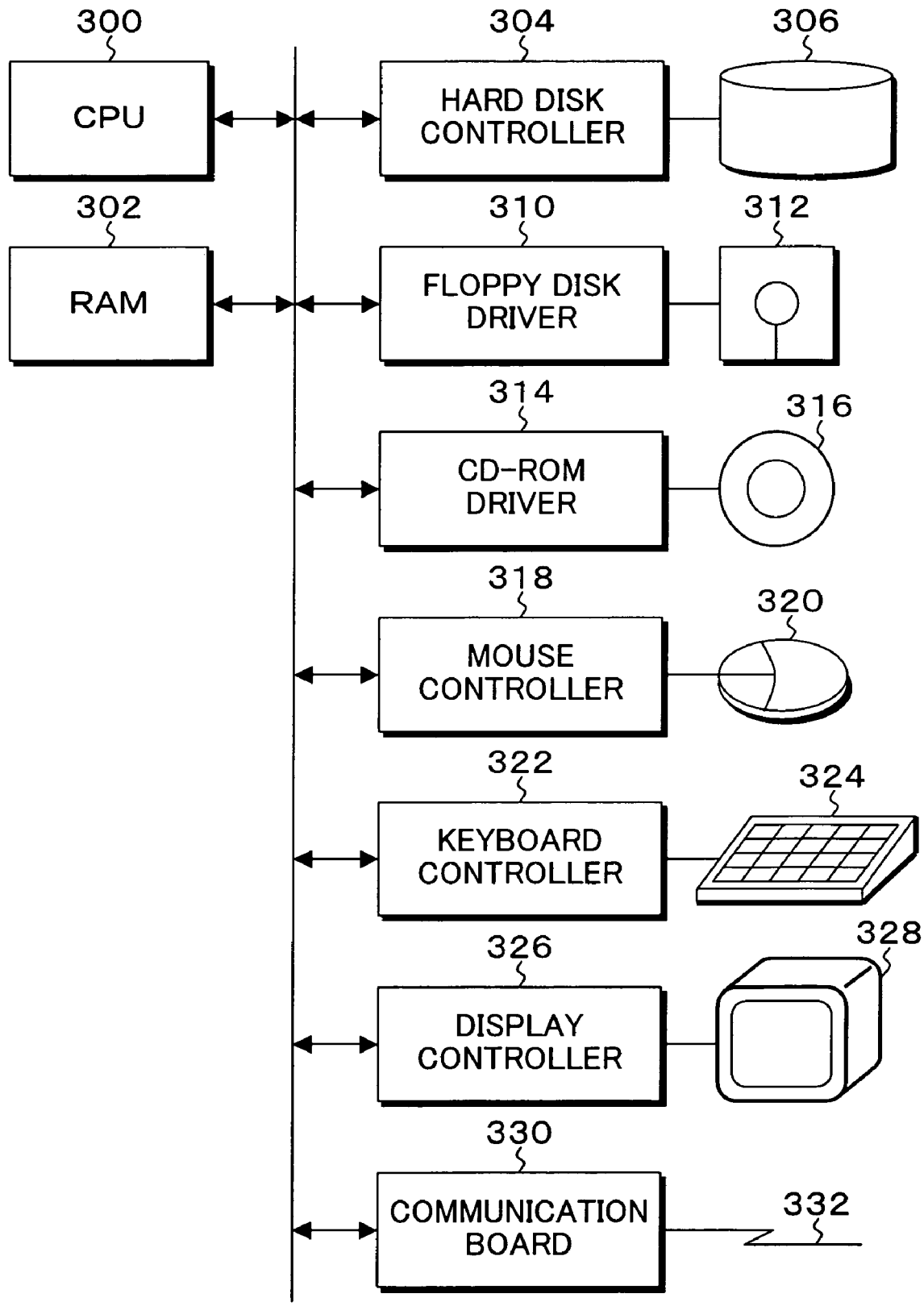
FIG. 2 is an explanatory drawing of a hardware environment of the computer constituting the server of FIGS. 1A and 1B.

Each of the production plan management server 10, the design management server 12, and the manufacturing management server 14 in FIGS. 1A and 1B can be implemented by the hardware resources of a computer such as those in FIG. 2. In the computer of FIG. 2, connected to a bus 301 of a CPU 300 are RAM 302, a hard disk controller (software) 304, a floppy disk driver (software) 310, a CD-ROM driver (software) 314, a mouse controller 318, a keyboard controller 322, a display controller 326, and a communication board 330. The hard disk controller 304 is connected to a hard disk drive 306, loads programs of design management and manufacturing management of the present invention, and, upon start-up of the computer, invokes necessary programs from the hard disk drive 306 and deploys them in the RAM 302 so as to execute them by the CPU 300. Note that each of the design terminal devices 18-1 to 18-3 and the manufacturing management terminal devices 20-1 to 20-3 can also be implemented by hardware resources of a computer similar to that of FIG. 2.

Figure 3:
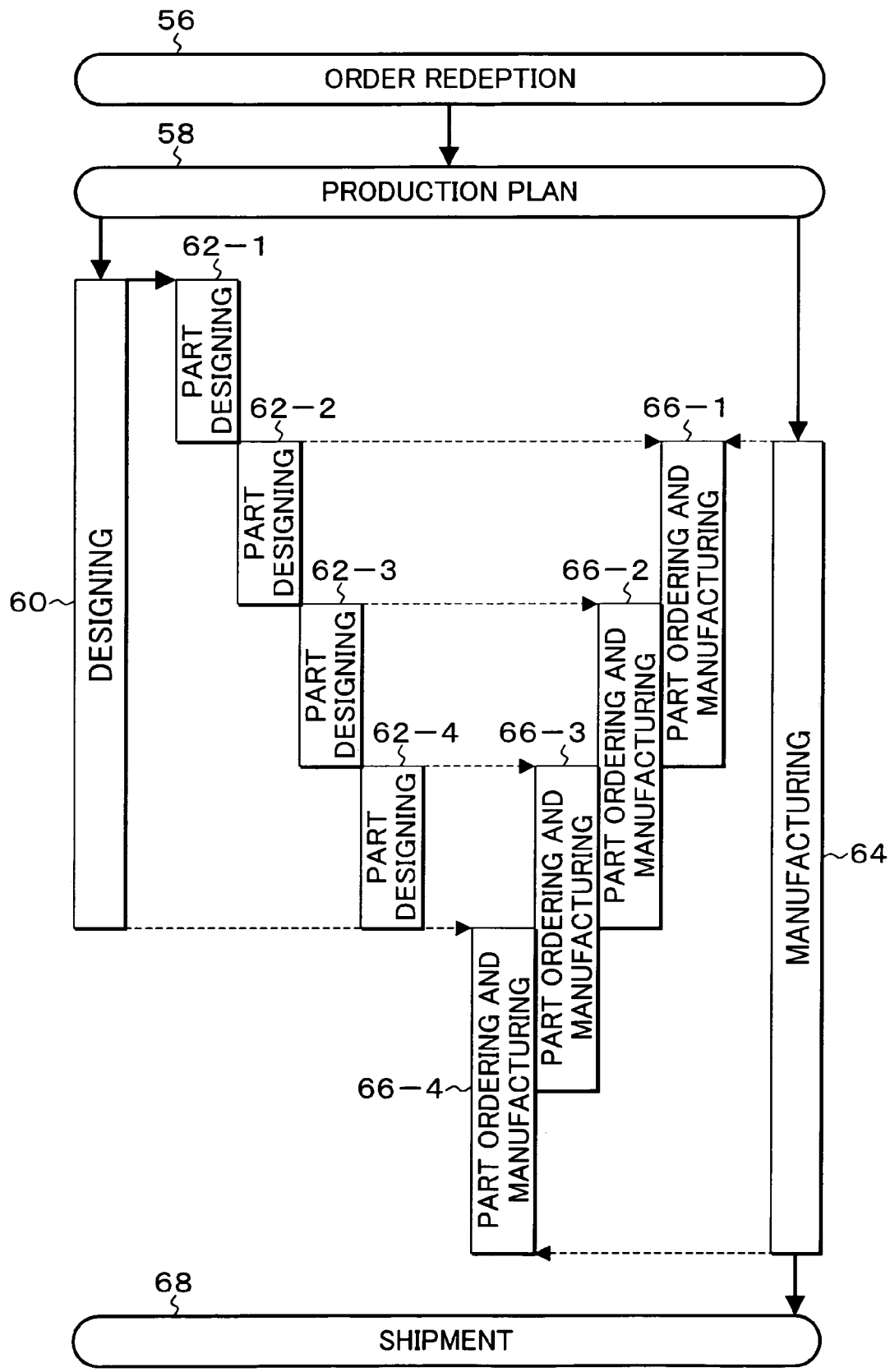
FIG. 3 is an explanatory diagram showing the procedure from order reception to shipment of a product to be managed by the present invention.

FIG. 3 is an explanatory diagram showing an outline of the procedure from order reception to shipment of a product to be managed by the present invention. In FIG. 3, when order reception 56 of the product takes place, a production plan 58 is created. Designing 60 is started in accordance with the production plan 58. The designing 60 comprises sequentially performing part designing 62-1 to 62-4 of a plurality of parts constituting the product. When first part designing 62-1 in the designing 60 is completed, a design completion notice is given to manufacturing 64. In accordance with this, in the manufacturing 64 side, part ordering and manufacturing 66-1 of the part of which designing has been completed is started. Thereafter, each time each of the part designing 62-2 to 62-4 is completed, design completion notice is performed in the same manner, and part ordering and manufacturing 66-3 to 66-4 are performed. By virtue of such part ordering and manufacturing corresponding to the notice given to the manufacturing department each time part designing in designing 60 is completed, the lead time up to shipment 68 can be significantly reduced by performing designing operations and manufacturing operations in parallel, compare with the case in which manufacturing 64 is started after designing 60 is completed.

Figure 4:
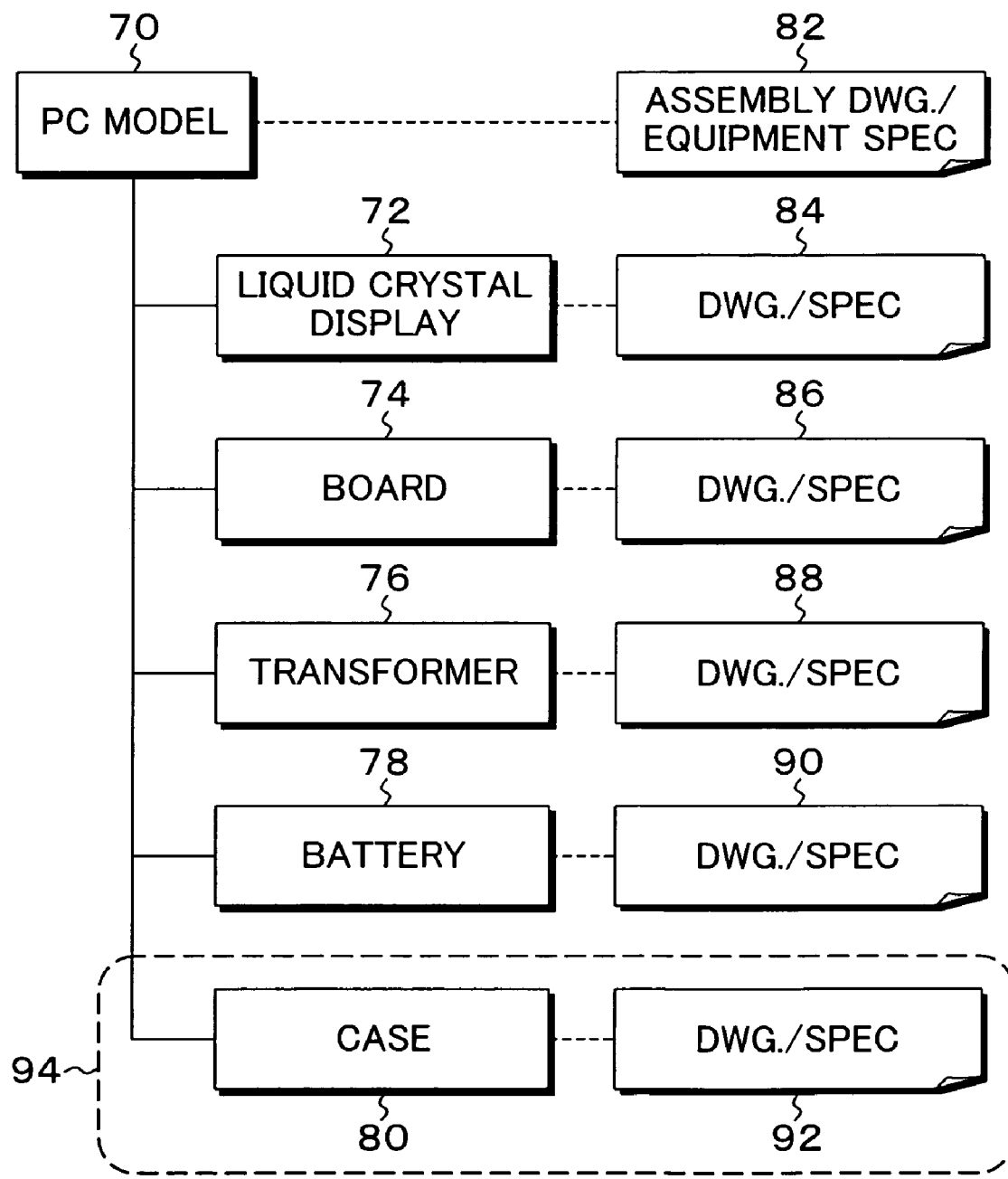
FIG. 4 is an explanatory diagram of a functional design of, for example, a personal computer according to the design management server of FIGS. 1A and 1B.

FIG. 4 is an explanatory diagram of a functional design of, for example, a personal computer according to the design management server of FIGS. 1A and 1B. In FIG. 4, when functional designing of a PC model (personal computer model) 70 as a product is to be performed, firstly, assembly/equipment specifications 82 are created. For the PC model 70, there performed, as parts designing, functional designing of a liquid crystal display 72, a board 74 on which a circuit is mounted, a transformer 76, a battery 78, and a case 80 serving as the components of the PC model.

For these parts, corresponding drawings/specifications 84, 86, 88, 90, and 92 are created in designing operations. When the designing operation of each of the drawings/specifications 84, 86, 88, 90, and 92 of the parts is completed, an E-BOM is created. For example, for the case 80, when the drawing/specifications 92 are completed, an E-BOM 94 including the entire information thereof is created.

Figure 5:
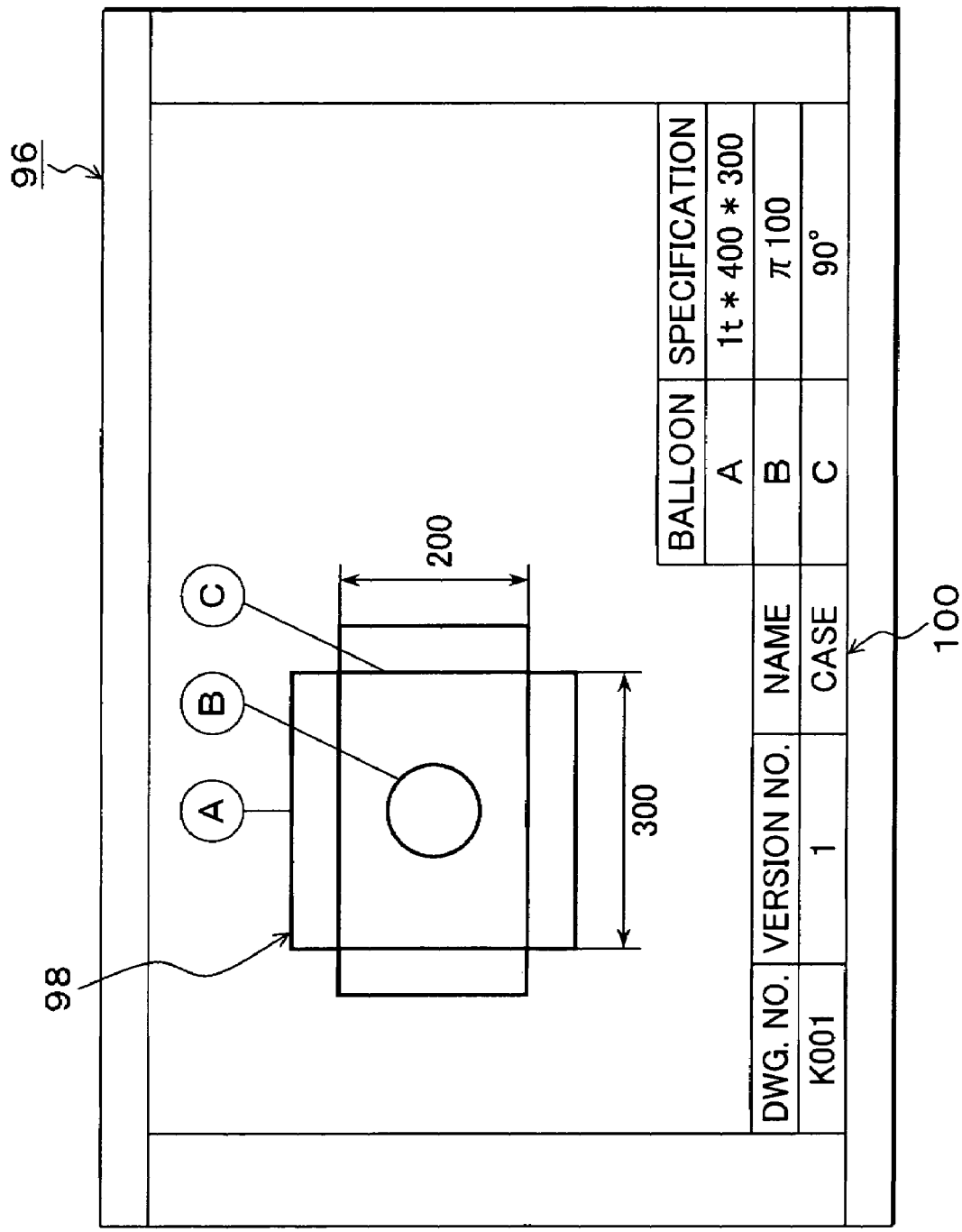
FIG. 5 is an explanatory drawing of a CAD drawing designed for the case of FIG. 4.

FIG. 5 is an explanatory drawing of a CAD drawing designed for the case 80 of FIG. 4. In FIG. 5, in a terminal screen 96 of, for example, a design terminal device 18-1 connected to the design management server 12 of FIGS. 1A and 1B via the LAN 16, a case drawing 98 of which designing has been completed is displayed. Case specifications 100 are displayed below the case drawing 98. In the case specifications 100, there shown, in addition to a drawing number, a version number (revision version number), and a name, corresponding to items A, B, and C of balloons shown with leader lines applied to the case drawing 98, $$(\text{thickness}) \times (\text{width}) \times (\text{height}) = 1 \text{t} \times 400 \times 300$$

is shown for the balloon A as a material size necessary for producing the case, "π100" is shown for the balloon B as the diameter of a hole, and an angle "90°" used in a bending process is shown for the balloon C.

FIG. 6 is an explanatory diagram of the E-BOM 94 created in accordance with the case drawing 98 and the case specifications 100 of FIG. 5. In FIG. 6, the E-BOM 94 comprises a drawing number 102, a revision version number 104, a name 106, an item number 108, balloons 110, specifications 112, and cost 114. In addition to that, in the present invention, design change information 116 created from the design verification information stored in the design verification database 50 provided in the manufacturing management server 14 side of FIGS. 1A and 1B are added. The design change information 116 is generated from the preparation information according to manufacturing instructions and ordering instructions necessary for manufacturing the case. For example, when the order instruction of a plate material serving as the material for processing the case is finished, "forbidden" is set as the design change information 116 since the design of the material size corresponding to the balloon A cannot be changed. Meanwhile, at the stage when the plate material serving as the material of the case has not yet been delivered, the work instruction of the boring process of the balloon B or the bending process of the balloon C has not yet been given. Therefore, design of the part corresponding to that can be changed, and "permitted" is set as the design change information 116. Such design change information 116 in the E-BOM 94 is created through coordination with the design change verification information created and managed in the manufacturing management server side.

Figure 7A:
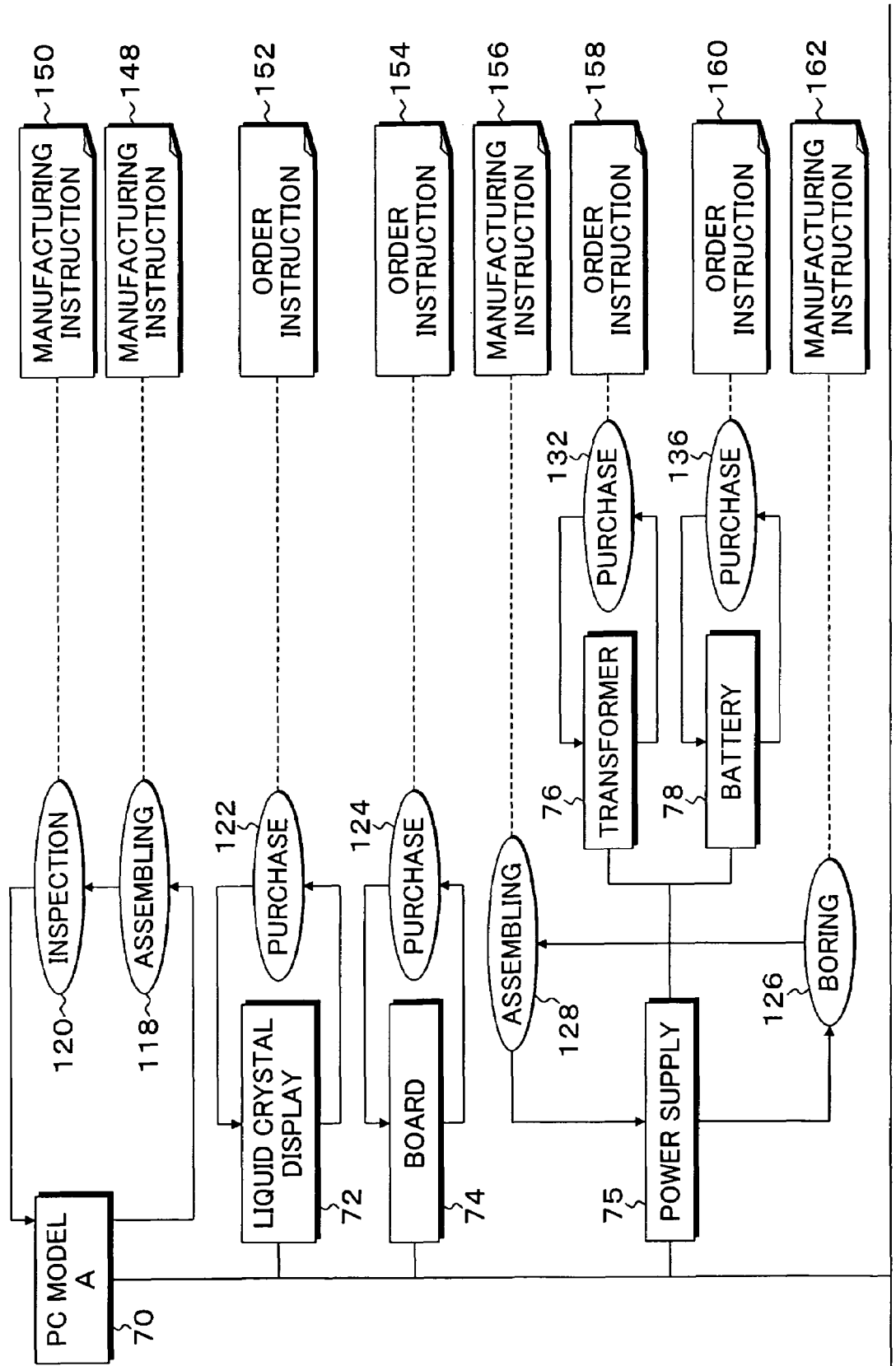
FIGS. 7A and 7B are explanatory diagrams of the structure of the M-BOM created from the E-BOM of the personal computer of FIG. 4.
Figure 7B:
Figure 7B:
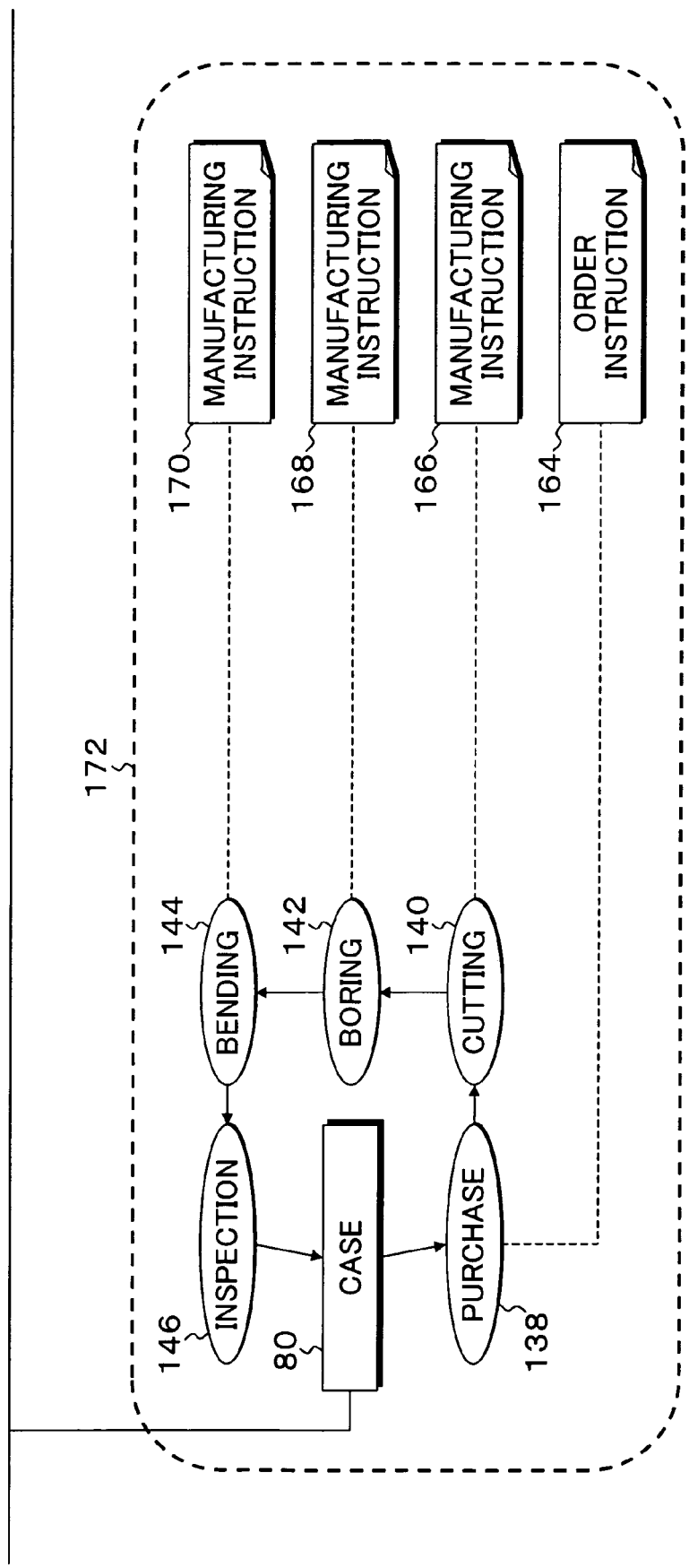

FIGS. 7A and 7B is an explanatory diagram of processing methods, procedures, and manufacturing instructions and order instructions in a M-BOM created in the manufacturing management server 14 in accordance with the E-BOM of FIG. 4 created in the design management server 12 for the personal computer. In FIGS. 7A and 7B, assembling 118 and inspection 120 are performed for the PC model 70, and manufacturing instruction descriptions 148 and 150 are created so as to correspond to each of them. Purchase 122 is set for the liquid crystal display 72, and an order instruction description 152 is correspondingly created. Purchase 124 is set also for the board 74 in the same manner, and an order instruction description 154 is created. Regarding the transformer 75 and the battery 78, the power supply 76 can be produced as one part by assembling them both. For the transformer 76 and the battery 78 set are purchase 132 and 136, and order instruction descriptions 158 and 160 are created, respectively. For the purchased transformer 76 and the battery 78 set are boring 126 and assembling 128 thereby producing the power supply 76. Regarding the case 80, purchase 138 of the case material is set and an order instruction description 164 is created, then, in the processing procedure, after cutting 140, boring 142, and bending 144, inspection 146 is finally set. With respect to the processings of the cutting 140, the boring 142, and the bending 144, manufacturing instruction descriptions 166, 168, and 170 are created. Herein, as a M-BOM of the present invention, for example, for the case 80, a M-BOM 172 having the information within the range shown by a broken line is created.

FIGS. 8A, 8B, and 8C are explanatory diagrams of the M-BOM 172 created for the case 80 of FIGS. 7A and 7B. FIG. 8A is a M-BOM 172, and for the M-BOM 172 created are an order instruction description 164 of FIG. 8B and three manufacturing instruction descriptions 166, 168, and 170 of FIG. 8C. The M-BOM 172 of FIG. 8A comprises an item number 174, a revision number 176, a name 178, a drawing number 180, balloons 182, procedures 184, process codes 186, process names 188, cost 190, and preparation information 192. Among these, the items unique to the M-BOM 172 include the procedures 184, the process codes 186, the process names 188, and the preparation information 192, moreover, in addition to the procedures of cutting, boring, and bending corresponding to the balloons A, B, and C, "purchase" is set as a first process name 188 and "inspection" is set in the last place which are unique to manufacturing.

In the preparation information 192, the progress state of order instructions or manufacturing instructions corresponding to each process is recorded. In this example, the order instructions of "purchase" in the process names 188 have been completed, the manufacturing instructions of "cutting" which is the next one in the process names 188 have been given out, and the processes of boring and those following that are unprocessed; therefore the manufacturing progress state of the case can be understood by the preparation information 192. FIG. 8B is the order instruction description 164 which comprises an item number 174, a name 178, a vendor 194, the number of ordered pieces 196, an order date 198, and a due 200. FIG. 8C comprises the manufacturing instruction descriptions 166, 168, and 170 corresponding to cutting, boring, and bending, respectively. As representatively shown in the manufacturing instruction description 166, each of the descriptions comprises an item number 174, a name 178, a drawing number 180, a procedure 184, a process name 188, a process code 186, a specification 202, the number of pieces to be processed 204, and work due 206.

FIG. 9 is an explanatory diagram of the design change verification information created in accordance with the M-BOM of the case of FIGS. 8A, 8B, and 8C, and the order instruction description 164 and the manufacturing instruction descriptions 166, 168, and 170 added thereto. In FIG. 9, design change verification information 208 of the case comprises a drawing number 210, a revision version number 212, an item number 214, balloons 216, procedures 218, process codes 220, and preparation information 222. The design change verification information 208 reflects, as coordination information, the progress state of manufacturing and ordering of the part corresponding in the manufacturing department when the design is to be changed in the design management server 12 of FIGS. 1A and 1B. With the design change verification information, when the drawing subjected to designing is displayed in a screen, the design change display processing unit 42 causes forbiddance or permission of design change performed on the contents of the corresponding design specifications to be displayed, in accordance with the progress state according to the preparation information. In the design change verification information 208 of FIG. 9, regarding the preparation information 222, "completed" is recorded as the preparation information 222 for the material of the case corresponding to the balloon A since the manufacturing instructions have already been given out therefor from the preparation information 192 of FIG. 8A, and "unprocessed" is recorded for boring and bending of the balloons B and C since the manufacturing instructions thereof have not yet been given out from the preparation information 192 of the M-BOM 172 of FIG. 8A.

Figure 10:
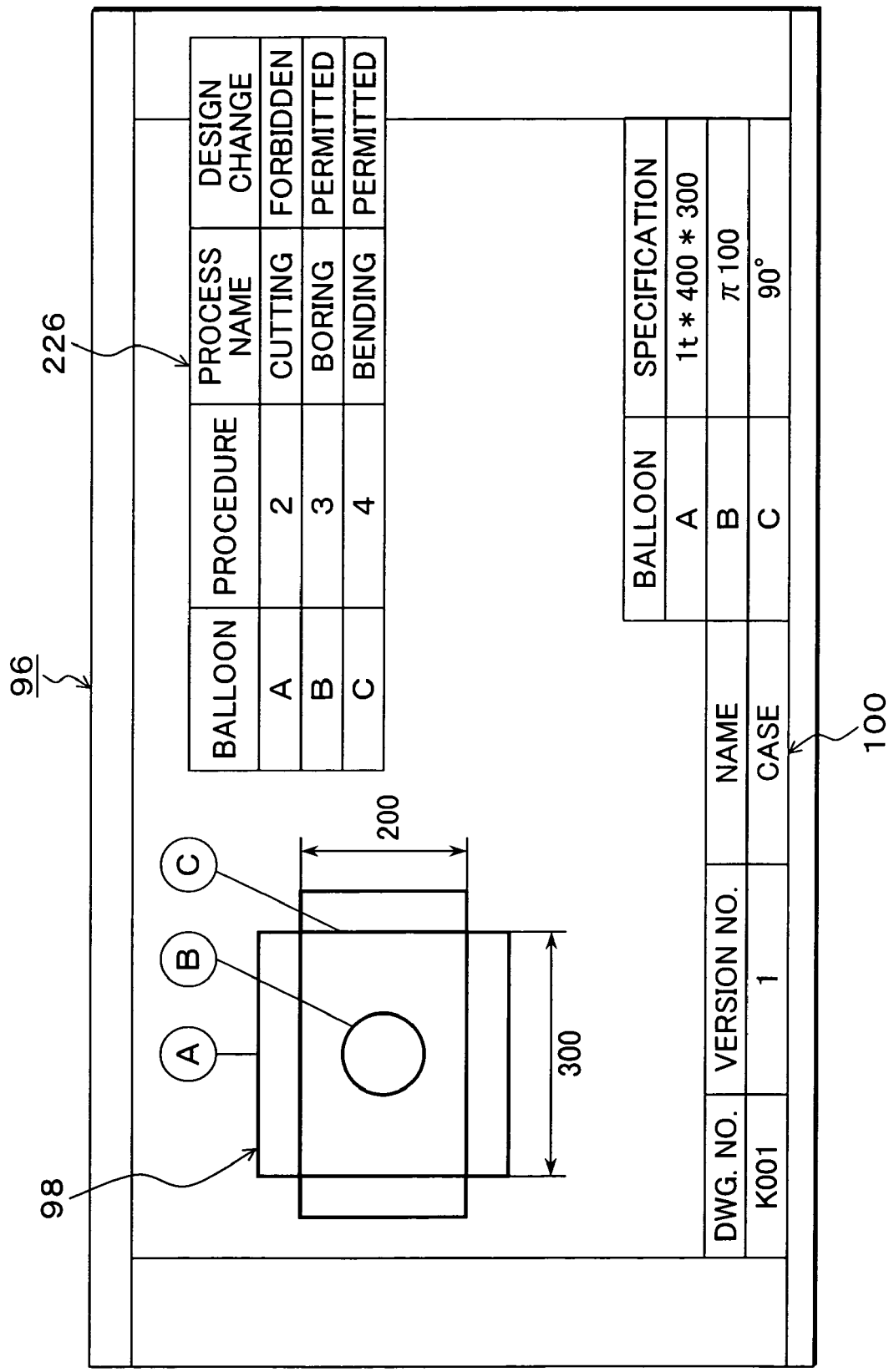
FIG. 10 is an explanatory drawing of a terminal screen in which, upon design change operation, permission and forbiddance of design change are windowed in accordance with the design change verification information of FIG. 9.

FIG. 10 is an explanatory drawing of a terminal screen in which, upon design change operation, permission and forbiddance of design change are windowed in accordance with the design change verification information of FIG. 9. In FIG. 10, corresponding to a design change request from, for example, the design terminal device 18-1 connected thereto via the LAN 16, the design management server 12 of FIGS. 1A and 1B displays the case drawing 98 and the case specifications 100 in the terminal screen 96 of the design terminal device 18-1, by referencing the CAD drawing database 34, the E-BOM database 36, and the design verification database 50 managed in the manufacturing management server 14 side, while using the drawing number "K001" of the case to be subjected to design change as a key, and obtaining the CAD drawing of the case, the E-BOM 94 of FIG. 6, and the design change verification information 208 of FIG. 9.

Furthermore, in accordance with the preparation information 222 of the design change verification information 208 of FIG. 9, a design changeable range displaying window 226 showing a procedure, a process name, and design change information correspondingly to each of the balloons A, B, and C is displayed. With the design changeable range displaying window 226, the persons in charge are able to immediately understand that design change cannot be performed on the material due to the progress state of the manufacturing stage, since design change of the material and the size of the case specified in the balloon A in the case drawing 98 is forbidden. Meanwhile, the design change information of boring and bending of the balloons B and C is "permitted". Therefore, it can be recognized that processings thereof have not yet been instructed in the manufacturing stage, required design change can be performed on, for example, boring of the balloon B, i.e., the size of the hole and the bending angle of the balloon C, which are serving as the design change objects. Certainly, when design is to be changed, determination and displaying of design change forbiddance and permission vary depending on the object part, therefore the design change verification information may be created so as to reflect detailed analysis results of the actual progress state in the manufacturing stage, thereby displaying design change forbidden ranges and permitted ranges when design is to be changed. For example, in a case of a circuit board, at the beginning of the manufacturing stage of a printed substrate, design change of adding depressed units on the printed substrate is permitted, while design change of adding protruding units is forbidden. For example in this manner, management of design permitted ranges and forbidden ranges is performed in accordance of the progress state of the part manufacturing. In FIG. 10, design change forbidden ranges and permitted ranges are displayed by a window when the part drawing to be subjected to design change is displayed. However, in another displaying method, when an editing operation such as movement, deletion, or size change for changing the design of a part drawing is performed, a message forbidding design change may be displayed in accordance with the design change verification information at this point if design change is forbidden, thereby limiting the editing processes.

Figure 11B:
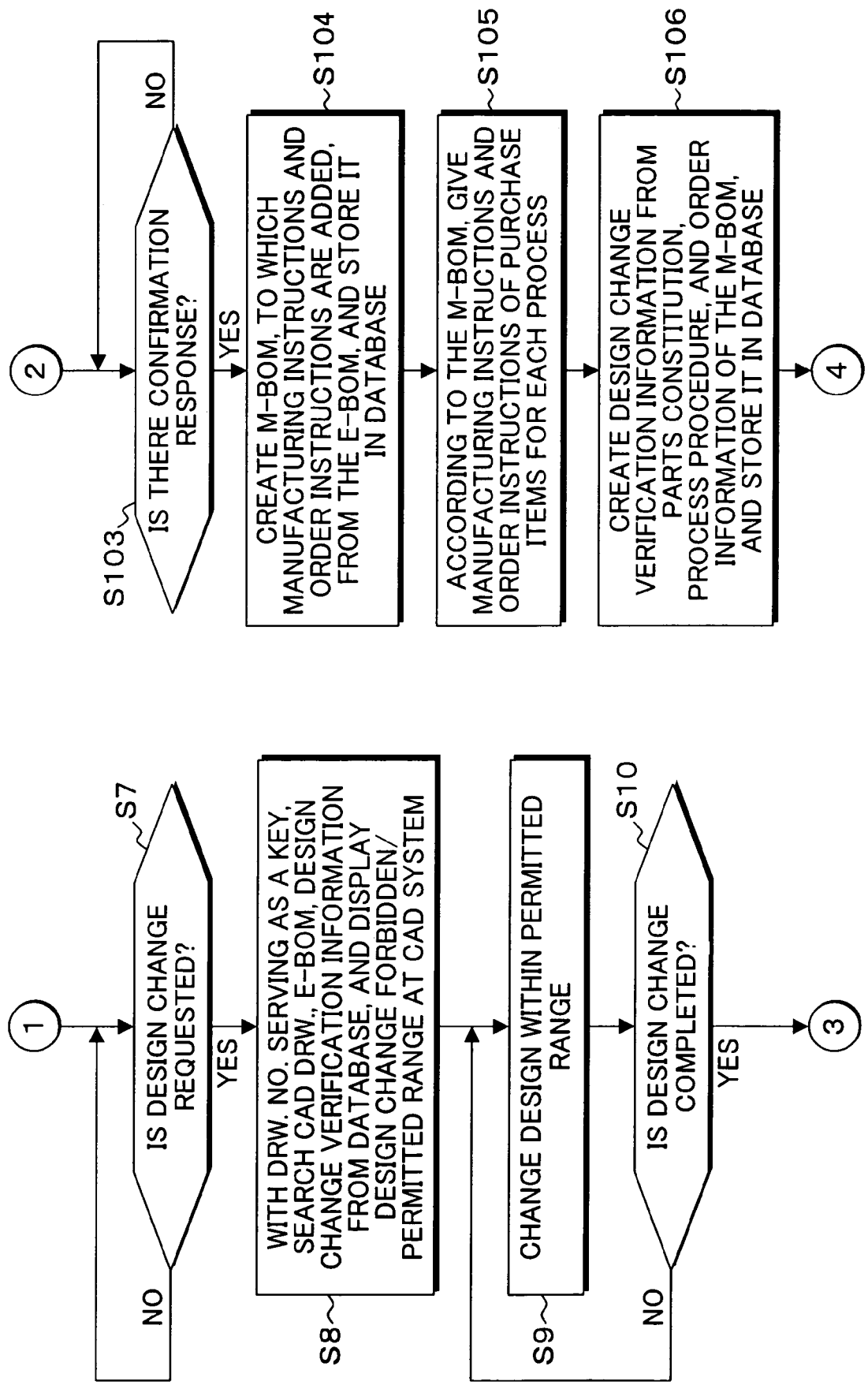
Figure 11C:
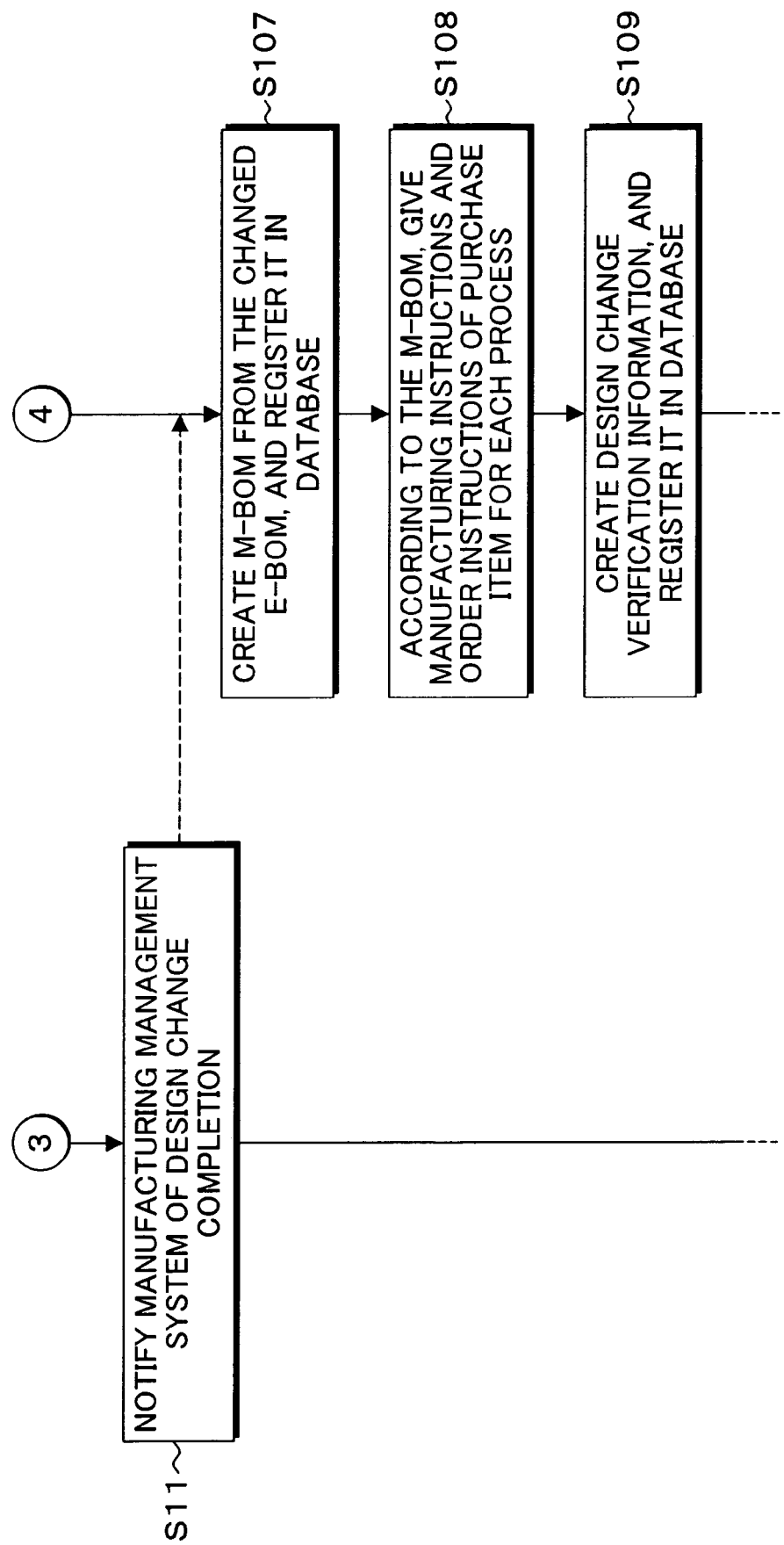

FIGS. 11A, 11B, and 11C are time charts of the management process for achieving coordination between the design management server 12 and the manufacturing management server 14 of FIGS. 1A and 1B. In FIGS. 11A, 11B, and 11C in the design management server 12, in a step S1, product designing is performed by the persons in charge using the design terminal devices 18-1 to 18-3 by use of the CAD 38. In a step S2, when part designing in product designing is completed, the process proceeds to a step S3 wherein the designed CAD drawing is stored in the CAD drawing database 34. Subsequently, in a step S4, the drawing edit management unit 40 creates an E-BOM from the design drawing stored in the CAD drawing database 34, and stores it in the E-BOM database 36. Subsequently, in a step S5, the manufacturing management server 14 is notified of design completion. Such processes of the steps S1 to S5 are repeated until designing of all parts is completed in a step S6. In the manufacturing management server 14, a part design management notice from the design management server 12 is received in a step S101, and, in a step S102, confirmation requests corresponding to the design part completion notice are output to the manufacturing management terminal devices 20-1 to 20-3 side, thereby notifying the persons in charge by means of screen display. When, corresponding to the confirmation requests, confirmation response through input operations of the persons in charge in the manufacturing management terminal device 20-1 to 20-3 side is determined in a step S103, the process proceeds to a step S104, wherein the corresponding E-BOM is obtained from the E-BOM database 36 of the design management server 12 by use of the drawing number of the notified design-completed part, and a M-BOM to which manufacturing instructions and order instructions are added is created in accordance with the E-BOM and stored in the M-BOM database 48. Subsequently, in a step S105, manufacturing instructions of each process and order instructions of items to be purchased, and so on are performed in accordance with the created M-BOM. Subsequently, in a step S106, the design change verification processing unit 54 creates, from the part-composing process procedures and order information of the M-BOM, design change verification information used for setting designing permitted ranges and forbidden ranges in design change, and stores it in the design verification database 50. Meanwhile, in the design management server 12, presence of a design change request from the design terminal devices 18-1 to 18-3 side is checked in a step S7. When a design change request is determined, the process proceeds to a step S8, wherein the CAD drawing, the E-BOM, and the design change verification information are searched and obtained, wherein the drawing number is used as a key, from the CAD drawing database 34, the E-BOM database 36, and the design verification database 50 of the manufacturing management server 14 side, and design change permitted ranges and forbidden ranges are displayed together with the CAD drawing and the specifications on the terminal screen of the design terminal device on which the design change request is performed. In accordance with the display of the design permitted ranges and design forbidden ranges according to the progress state which is that in the manufacturing side and relating to design change of the CAD drawing displayed in the terminal screen, design change is performed in the permitted ranges in a step S9. When completion of the design change operation is determined in a step S10, the process proceeds to a step S11, wherein the manufacturing management server 14 is notified of the design change completion. Corresponding to the notice of the design change completion from the design management server 12, the manufacturing management server 14 creates a M-BOM from the changed E-BOM and registers it in the database 48 in a step S107. Creation of the M-BOM in this case can be implemented, specifically, merely by updating the contents of the items, to which design change has been performed, in the already created M-BOM before design change. Next, in accordance with needs, manufacturing instructions of each step and order instructions of the items to be purchased are performed in accordance with the M-BOM in a step S108, and design change information is created and registered in the design change information database 50 in a step S109. Also in this case, creation of the design change verification information can be performed merely by updating the part changed after design change in the already created design verification information before design change.

Figure 12:
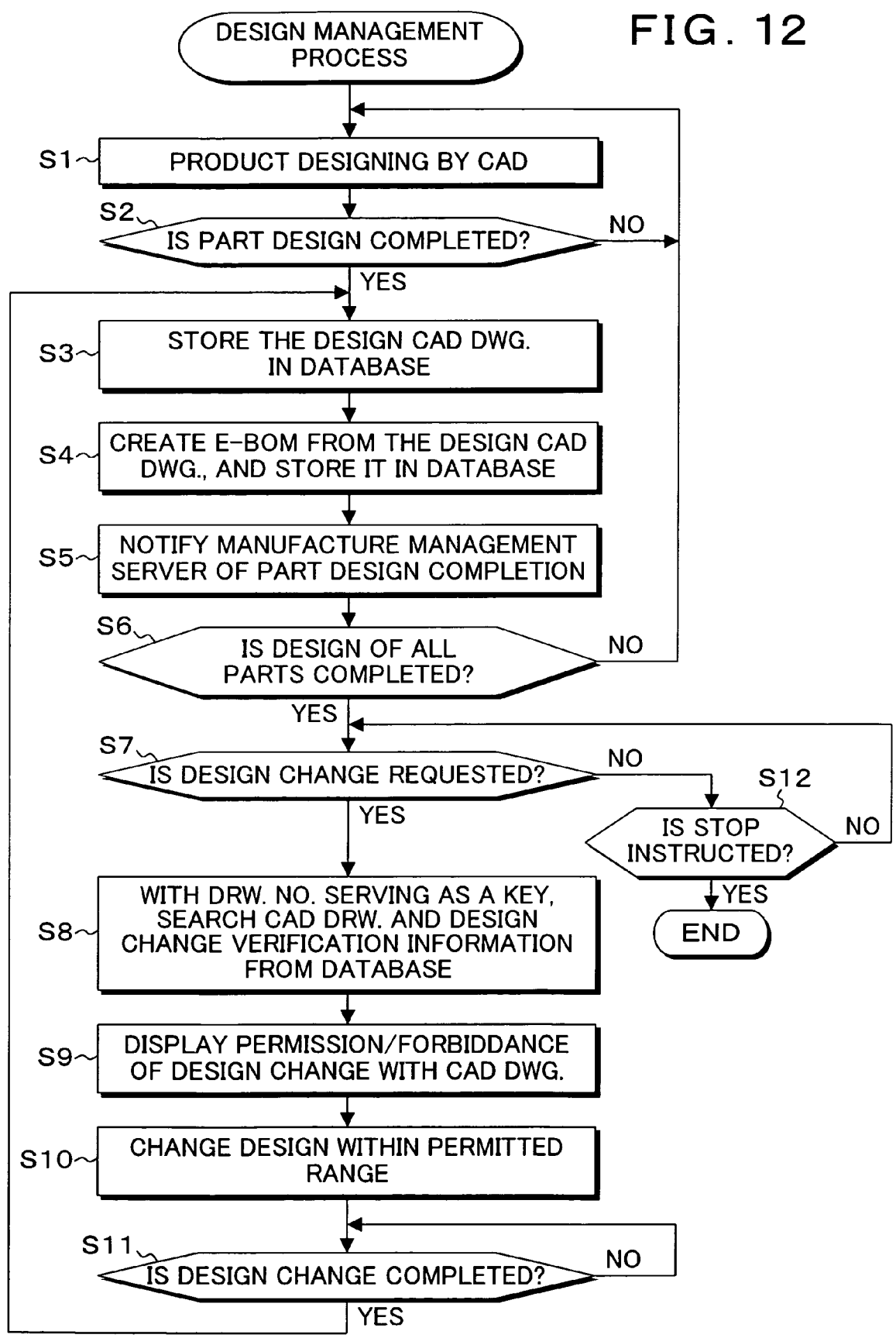
FIG. 12 is a flow chart of the design management process performed by the design management server of FIGS. 1A and 1B.

FIG. 12 is a flow chart of the design management process performed by the design management server 12 of FIGS. 1A and 1B. In FIG. 12, in the design management process, product designing using the CAD processing unit 38 performed by the persons in charge in the design terminal devices 18-1 to 18-3 side is managed in a step S1, and each time designing of a part is completed in a step S2, the process proceeds to a step S3 wherein the designed CAD drawing is stored in the CAD drawing database 34. Subsequently, in a step S4, the drawing edit management unit 40 creates an E-BOM from the designed CAD drawing, and stores it in the E-BOM database 36. Subsequently, in a step S5, via the LAN 16, the drawing edit management unit 40 notifies the manufacturing management server 14 of the design completion of the part.

Subsequently, in a step S6, whether designing of all parts has been completed or not is checked, and the processes from the step S1 to S6 are repeated until design completion. When designing of all parts is completed, the process proceeds to a step S7. In the step S7, presence of a design change request is checked. If any design change request is not found, presence of a stop instruction of the server is checked in a step S12 wherein the process is terminated if a stop instruction is found. If a design change request is determined in the step S7, the process proceeds to a step S8, wherein, while using the drawing number as the key, the CAD drawing, the E-BOM, and design change verification information are searched from the CAD drawing database 34, the E-BOM database 36, and the design verification database 50 of the manufacturing management server 14, and, in a step S9, the CAD drawing is displayed on the terminal screen together with the design change permitted ranges and forbidden ranges. Subsequently, in a step S10, design change is performed within the permitted ranges, and if design change completion is determined in a step S11, the process returns to the step S3, wherein the design-completed CAD drawing is stored in the CAD drawing database 34. Then, in the step S4, an E-BOM is created from the design-changed CAD drawing and stored in the E-BOM database 36. Creation of the E-BOM in this case is performed by updating merely the part changed in design change in the already-created E-BOM. Then, in the step S5, the manufacturing management server 14 is notified of design completion of the part corresponding to the design change.

Figure 13:
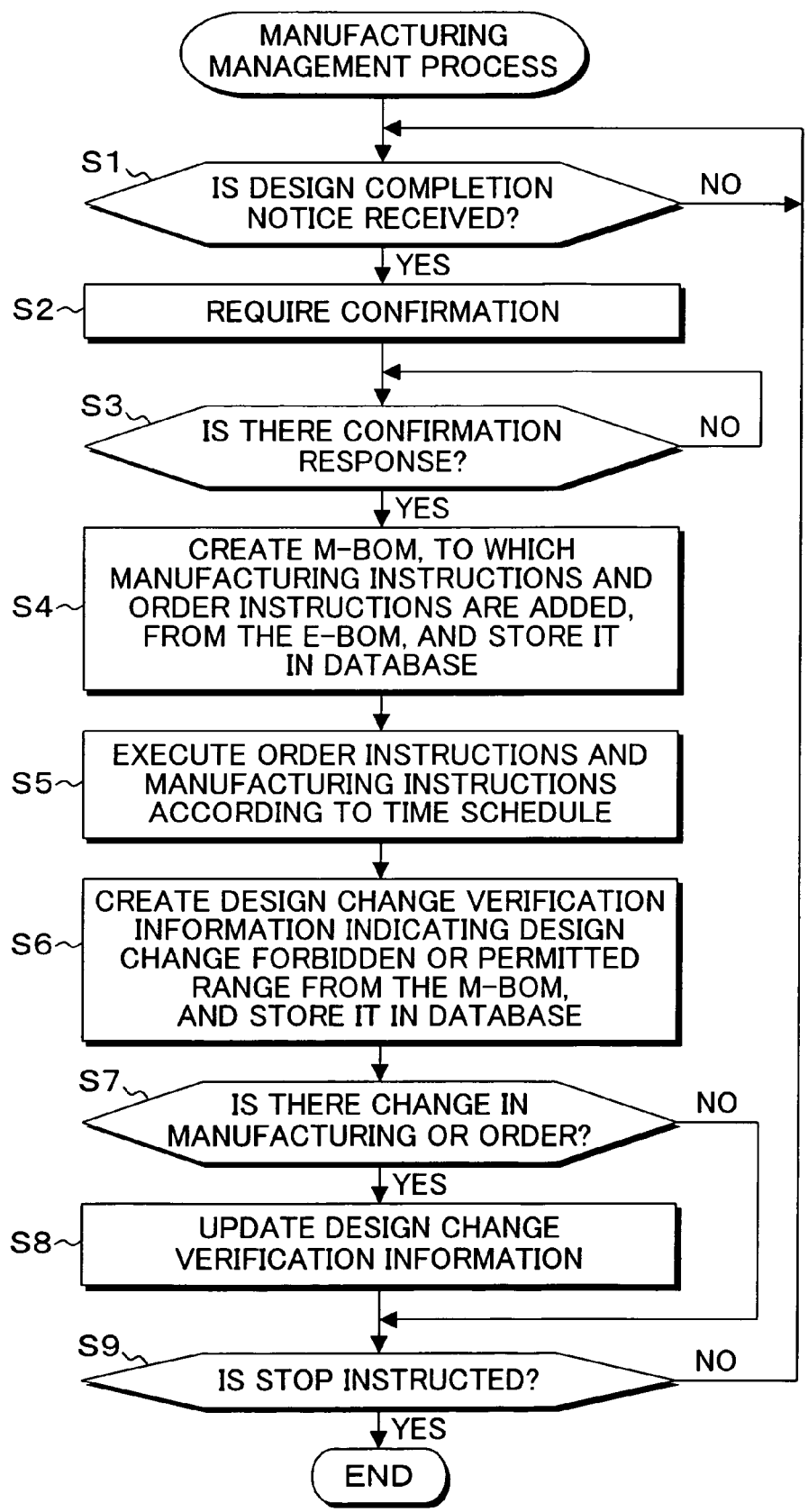
FIG. 13 is a flow chart of the manufacturing management process performed by the manufacturing management server of FIGS. 1A and 1B.

FIG. 13 is a flow chart of the manufacturing management process performed by the manufacturing management server 14 of FIGS. 1A and 1B. In FIG. 13, in the manufacturing management process, presence of the reception of a design completion notice from the design management server 12 is checked in a step S1. When a design completion notice is received, in a step S2, reception confirmation of the design completion notice is required to the manufacturing management terminal device side. When confirmation response is made from the manufacturing management terminal device side in a step S3, the process proceeds to a step S4, wherein an M-BOM to which manufacturing instructions and order instructions are added is created from the E-BOM of which design completion notice has been received, and stored in the M-BOM database 48. Subsequently, in a step S5, the order instructions and the manufacturing instructions are executed according to a time schedule. Then, in a step S6, design change verification information setting the preparation information indicating the design change forbidden or permitted range is created from the M-BOM, and stored in the design verification database 50. Subsequently, in a step S7, whether there is a change in manufacturing or ordering is checked. If there is a change, the contents of the preparation information corresponding to the design change verification information are updated in a step S8. Such processes of the step S1 to S8 are repeated until a stop instruction of the manufacturing management server 14 is found in a step S9. Furthermore, the present invention provides a design management program executed by a computer of the design management server 12. The design management program comprises a program architecture having a format for causing the computer to execute the processing procedure shown in the flow chart of FIG. 12.

Furthermore, the present invention provides a manufacturing management program executed by the manufacturing management server 14. The manufacturing management program comprises a program architecture for causing a computer to execute the processing procedure shown in the flow chart of FIG. 13.

In the embodiment of FIGS. 1A and 1B, the CAD drawing database 34 and the E-BOM database 36 are disposed in the design management server 12, and the M-BOM database 48 and the design verification database 50 are disposed in the manufacturing management server, such that each of them performs creation and management of corresponding information. However, a database server may be provided independently from the design management server 12 and the manufacturing management server 14, such that the CAD drawing database 34, the E-BOM database 36, the design verification database 50, and the M-BOM database 48 can be managed by the dedicated database server. Moreover, in the embodiment of FIGS. 1A and 1B, the production plan management server 10 is separately provided as a management server of the design management server 12 and the manufacturing management server 14. However, the production plan management server 10 may be integrated with, for example, the manufacturing management server 14 as a function thereof.

Moreover, the embodiment of FIGS. 1A and 1B employs an example system of a server/client architecture in which the design terminal devices 18-1 to 18-3 are connected to the design management server 12 via the LAN 16, and the manufacturing management terminal devices 20-1 to 20-3 are connected to the manufacturing management server 14. However, only the databases may be provided in a dedicated database server, and the CAD processing unit 38, the drawing edit management unit 40, and the design change display processing unit 42 of the application execution environment 32 may be provided as functions of the design terminal devices 18-1 to 18-3 side. This regard also applies to the manufacturing management server 14, wherein a dedicated server may be provided for the databases, and the parts order management unit 52 and the design change verification processing unit 54 of the application execution environment 46 may be provided as functions of the manufacturing management terminal devices 20-1 to 20-3 side.

Furthermore, the present invention includes arbitrary modifications that do not impair the objects and the advantages thereof, and is not limited by the numerical values described in the above described embodiments.

What is claimed is:

1. A design and manufacturing management system composed of a production plan management server machine, a design management server machine and a manufacturing management server machine comprising:

a feedback management loop which connects the manufacturing management server machine to the design management server machine; and a production plan management unit of the production plan management server machine for making the production plan and instructing the design management server machine to design a product, wherein the design management server machine comprises:

a design processing unit for managing a design drawing of a product, which has been created by means of computer aid, by storing the design drawing in a design drawing database, a drawing edit management unit for managing an E-BOM created from the design drawing by storing the E-BOM in an E-BOM database, and for notifying the manufacturing management server machine of design completion, and a design change display processing unit for causing design change permitted range and forbidden range to be displayed, upon design change of the product, in accordance with design change verification information which is feedback information from the manufacturing management server machine and has been created and updated in the manufacturing management server machine in a design change verification database; and the manufacturing management server machine comprises:

a part order management unit for requesting confirmation when receiving the design completion notice from the drawing edit management unit, and managing a M-BOM, to which preparation information including an order instruction and a manufacturing instruction of a part is added and which has been created in accordance with the E-BOM after a confirmation response is input, by storing the M-BOM in a M-BOM database, and a design change verification processing unit for managing the design change verification information which has been created in accordance with the preparation information of the M-BOM by storing the design change verification information in the design verification database;

wherein the design change verification processing unit determines the design change permitted range and forbidden range in accordance with a progress state of the manufacturing instruction and order instruction of the part in the preparation information, and updates the design change verification information.

2. The design and manufacturing management system according to claim 1, wherein the drawing edit management unit notifies the part order management unit of design completion each time designing of a part of the product is completed.

3. The design and manufacturing management system according to claim 1, wherein the design change verification processing unit sets forbiddance of design change of the part on which the order instruction has been performed.

4. The design and manufacturing management system according to claim 1, wherein the design change verification processing unit sets forbiddance of design change of the part on which the manufacturing instruction has been performed.

5. The design and manufacturing management system according to claim 4, wherein the M-BOM sets a plurality of processes necessary for part processing, and the design change verification processing unit sets forbiddance of design change of the processed unit of the part on which the manufacturing instruction has been performed.

6. A design and manufacturing management method comprising:

producing a production plan in a production plan server machine and instructing a design management server machine to design a product based on the production plan;

connecting a manufacturing management server machine to a design management server machine using a feedback management loop;

manufacturing designed parts;

feeding back design change verification database information;

the design management server machine performing:
managing a design drawing of a product, which has been created by means of computer aid, by storing the design drawing in a design drawing database;
managing an E-BOM created from the design drawing by storing the E-BOM in an E-BOM database, and for notifying design completion;

the manufacturing management server machine performing:
requesting confirmation when receiving the design completion notice, and managing a M-BOM, to which preparation information including an order instruction and a manufacturing instruction of a part is added and which has been created in accordance with the E-BOM after a confirmation response is input, by storing the M-BOM in a M-BOM database;
managing design change verification information which has been created in accordance with the preparation information of the M-BOM by storing the design change verification information in the design verification database; and
causing design change permitted range and forbidden range to be displayed, upon design change of the product, in accordance with the design change verification information which is feedback information from the manufacturing management server machine and has been created and updated in the manufacturing management server machine and is in the design change verification database;

wherein the design change permitted range and forbidden range are determined in accordance with a progress state of the manufacturing instruction and the order instruction of the part in the preparation information, and the design change verification information is updated.

7. The design and manufacturing management method according to claim 6, wherein, the part order management unit is notified of design completion each time designing of a part of the product is completed.

8. The design and manufacturing management method according to claim 6, wherein, forbiddance of design change of the part on which the order instruction has been performed is set.

9. The design and manufacturing management method according to claim 6, wherein, forbiddance of design change of the part on which the manufacturing instruction has been performed is set.

10. The design and manufacturing management method according to claim 9, wherein the M-BOM sets a plurality of processes necessary for part processing, and, forbiddance of design change of the processed unit of the part on which the manufacturing instruction has been performed is set.

11. A computer-readable storage medium which stores a program for causing computer servers of a design management system to execute operations comprising:

producing a production plan in a production plan server machine and instructing a design management server machine to design a product based on the production plan;

connecting a manufacturing management server machine to a design management server machine using a feedback management loop;

manufacturing designed parts; and feeding back design change verification database information;

the design management server machine performing:
managing a design drawing of a product, which has been created by means of computer aid, by storing the design drawing in a design drawing database;
managing an E-BOM created from the design drawing by storing the E-BOM in an E-BOM database, and for notifying the manufacturing management server machine of design completion; and the manufacturing management server machine performing:
requesting confirmation when receiving a design completion notice from the design management server machine, and managing a M-BOM, to which preparation information including an order instruction and a manufacturing instruction of a part is added and which has been created in accordance with an E-BOM in an E-BOM database after a confirmation response is input, by storing the M-BOM in a M-BOM database: and
managing design change verification information which has been created in accordance with the preparation information of the M-BOM by storing the design change verification information in a design verification database;

causing design change permitted range and forbidden range to be displayed, upon design change of the product, in accordance with the design change verification information which is feedback information from the manufacturing server machine and has been created and updated in the manufacturing management server machine and is in the design change verification database, wherein the design change permitted range and forbidden range are determined in accordance with a progress state of the manufacturing instruction and the order instruction of the part in the preparation information, and the design change verification information is updated.

12. The storage medium according to claim 11, wherein, the manufacturing management server machine is notified of design completion each time designing of a part of the product is completed.

13. The storage medium according to claim 11, wherein, forbiddance of design change of the part on which the order instruction has been performed is set.

14. The storage medium according to claim 11, wherein, forbiddance of design change of the part on which the manufacturing instruction has been performed is set.

15. The storage medium according to claim 14, wherein the M-BOM sets a plurality of processes necessary for part processing, and forbiddance of design change of the processed unit of the part on which the manufacturing instruction has been performed is set.

* * * * *

UNITED STATES PATENT AND TRADEMARK OFFICE
CERTIFICATE OF CORRECTION

| | |
|---|---|
| PATENT NO. | : 7,606,628 B2 |
| APPLICATION NO. | : 11/104616 |
| DATED | : October 20, 2009 |
| INVENTOR(S) | : Azuma |

It is certified that error appears in the above-identified patent and that said Letters Patent is hereby corrected as shown below:

Column 14, Line 35, change "machine" to --machine,--.

Column 16, Line 65, change "database:" to --database;--.

Signed and Sealed this

Nineteenth Day of January, 2010

David J. Kappos
*Director of the United States Patent and Trademark Office*